(12) United States Patent
Lee et al.

(10) Patent No.: US 6,258,407 B1
(45) Date of Patent: *Jul. 10, 2001

(54) PRECURSORS FOR MAKING LOW DIELECTRIC CONSTANT MATERIALS WITH IMPROVED THERMAL STABILITY

(75) Inventors: Chung J. Lee; Hui Wang, both of Fremont; Giovanni Antonio Foggiato, Morgan Hill, all of CA (US)

(73) Assignee: Quester Technology, Inc., Fremont, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/440,297

(22) Filed: Nov. 15, 1999

Related U.S. Application Data

(62) Division of application No. 08/957,481, filed on Oct. 24, 1997, now Pat. No. 6,020,458.

(51) Int. Cl.[7] ............ C23C 16/00; C23C 16/513
(52) U.S. Cl. ............ 427/255.28; 427/489; 427/490; 427/509; 427/578; 427/569; 427/582; 427/583; 427/585; 438/789; 438/790
(58) Field of Search ............ 427/489, 490, 427/497, 509, 578, 569, 582, 583, 585, 255.28; 438/780, 789, 790

(56) References Cited

U.S. PATENT DOCUMENTS

| | | |
|---|---|---|
| 3,440,277 | 4/1969 | Holland et al. |
| 4,291,244 | 9/1981 | Beach et al. |
| 4,657,777 * | 4/1987 | Hirooka et al. ............ 427/39 |
| 5,139,813 | 8/1992 | Yira et al. |
| 5,210,341 | 5/1993 | Dolbier, Jr. et al. |
| 5,268,202 | 12/1993 | You et al. |
| 5,324,813 | 6/1994 | Hougham et al. |
| 5,334,454 | 8/1994 | Caporiccio et al. |
| 5,424,097 | 6/1995 | Olson et al. |
| 5,534,068 | 7/1996 | Beach et al. |
| 5,536,317 | 7/1996 | Crain et al. |

(List continued on next page.)

FOREIGN PATENT DOCUMENTS

| | | |
|---|---|---|
| 0 769 788 A2 | 4/1997 | (EP). |
| 60-231442 | 11/1985 | (JP). |
| WO 97/15951 | 10/1995 | (WO). |
| WO 97/14666 | 4/1997 | (WO). |
| WO 97/15699 | 5/1997 | (WO). |
| 97/15951 * | 5/1997 | (WO). |
| WO 98/24743 | 6/1998 | (WO). |
| WO 98/41490 | 9/1998 | (WO). |

OTHER PUBLICATIONS

Jozef Bicerano, *Prediction of Polymer Properties*, Second Edition, Marcel Dekker, Inc., pp. 1–15, 50–61, 108–111, and 280–295, 1996.

(List continued on next page.)

*Primary Examiner*—Shrive Beck
*Assistant Examiner*—Michael Barr
(74) *Attorney, Agent, or Firm*—Fliesler, Dubb, Meyer & Lovejoy

(57) ABSTRACT

Fluorinated chemical precursors, methods of manufacture, polymer thin filmswith low dielectric constants, and integrated circuits comprising primarily of $sp^2C$—F and some hyperconjugated $sp^3C$—F bonds are disclosed in this invention. Precursors are disclosed for creating fluorinated silanes and siloxanes, and fluorinated hydrocarbon polymers. Thermal transport polymerization (TP), chemical vapor deposition (CVD), plasma enhanced CVD (PECVD), high density PECVD (HDPCVD), photon assisted CVD (PACVD), and plasma-photon assisted (PPE) CVD and PPETP of these chemicals provides thin films with low dielectric constants and high thermal stabilities for use in the manufacture of integrated circuits.

68 Claims, 6 Drawing Sheets

U.S. PATENT DOCUMENTS

| | | |
|---|---|---|
| 5,536,319 | 7/1996 | Wary et al. . |
| 5,536,321 | 7/1996 | Olsen et al. . |
| 5,536,322 | 7/1996 | Wary et al. . |
| 5,536,892 | 7/1996 | Dolbier, Jr. et al. . |
| 5,538,758 | 7/1996 | Beach et al. . |
| 5,556,473 | 9/1996 | Olson et al. . |
| 5,637,395 | 6/1997 | Uemura et al. . |
| 5,783,614 | 7/1998 | Chen et al. . |
| 6,051,321 * | 4/2000 | Lee et al. ............... 428/447 |

OTHER PUBLICATIONS

Lee, Transport Polymerization of Gaseous Intermediates and Polymer Crystals Growth, J. Macromol. Sci.—Rev. Macromol. Chem., C16(1), 79–127 (1977–1978).

McClatchie, et al., Low Dielectric Constant Flowfill Technology for IMD Applications, Feb. 10–11, 1997, DUMIC Conference, 1997 ISMIC—222D/97/0034, 34–40.

Sugahara, et al., Low Dielectric Constant Carbon Containing $SiO_2$ Films Deposited by PECVD Technique Using a Novel CVD Precursor, Feb. 10–11, 1997, DUMIC Conference, 1997 ISMIC—222D/97/0019, 19–25.

Shimogaki, et al., How Low Dielectric Constant of F–Doped $SiO_2$ Films Can be Obtained, Feb. 10–11, 1997, DUMIC Conference, 1997 ISMIC—222D/97/0034, 189–196.

Robles, et al., Characterization of High Density Plasma Chemical Vapor Deposited α–Carbon and α–Fluorinated Carbon Films for Ultra Low Dielectric Applications, Feb. 10–11, 1997, DUMIC Conference, 1997 ISMIC—222D/97/0026, 26–33.

Labelle, et al., Characterization of Pulsed–Plasma Enhanced Chemical Vapor Deposited Fluorocarbon Thin Films, Feb. 10–11, 1997, DUMIC Conference, 1997 ISMIC—222D/97/0098, 98–105.

J.I. Krochiwitz, Encyclopedia of Chem. Tech., vol. 5, 320–373, 1991.

J.J. McKetta, Encyclopedia of Chem. Proc. & Design, vol. 14, 276–291, 1992.

Meriaudeau, et al., Dehydrocyclization of Alkanes Over Zeolite–Supported Metal Catalysts: Monofunctional or Bifunctional Route, Catal. Rev. Sci. Eng., 39 (1&2), 5–48, 1997.

Lee, et al., Low–Dielectric Constant materials for ULSI Interlayer–Dielectric Applications, MRS Bulletin, 19–27, Oct. 1997.

Lu, et al., Vapor Deposition of Low–Dielectric–Constant Polymeric Thin Films, MRS Bulletin, 28–31, Oct 1997.

High Vacuum Electrical Feedthroughs Within Easy Reach, MDC Vacuum Products Corporation, Circle No. 12 on Reader Service Card, No date available.

Hacker, Organic and Inorganic Spin–on Polymers for Low–Dielectric–Constant Applications, MRS Bulletin, 38–77, Oct. 1997.

* cited by examiner

PRECURSORS FOR MAKING LOW DIELECTRIC CONSTANT MATERIALS WITH IMPROVED THERMAL STABILITY

This application is a Divisional Application of U.S. patent application Ser. No. 08/957,481, filed Oct. 24, 1997 now U.S. Pat. No. 6,020,458.

CROSS REFERENCES

Lee et al., Chemicals and Processes for Making Fluorinated Poly(Para-Xylylenes). Ser. No. 08/957,792, filed Oct. 24, 1997 now U.S. Pat. No. 6,140,456.

Lee et al., New Deposition Systems and Processes for Transport Polymerization and Chemical Vapor Deposition. Ser. No. 08/958,352, filed Oct. 24, 1997 now U.S. Pat. No. 6,086,679.

Lee et al., Low Dielectric Constant Materials with Improved Thermal and Mechanical Properties. Ser. No. 08/958,057, filed Oct. 24, 1997.

Lee et al., Low Dielectric Constant Materials Prepared from Photon or Plasma Assisted Chemical Vapor Deposition and Transport Polymerization of Selected Compounds. Ser. No. 08/957,480, filed Oct. 24, 1997 now U.S. Pat. No. 6,051,321.

All of the above co-pending applications are herein incorporated fully by reference.

FIELD OF THE INVENTION

This invention relates to the precursors for manufacturing dielectric materials with low dielectric constants for use in the manufacture of semiconductor integrated circuits. The invention also relates to the polymers made from these precursors, the processes used to make polymers, and the integrated circuits made from these polymers.

BACKGROUND OF THE INVENTION

As integrated circuits (ICs) have become progressively more microminiaturized to provide higher computing speeds, the low dielectric constant polymers used in the manufacturing of the ICs have proven to be inadequate in several ways. Specifically, they have not had sufficient thermal stability, generate toxic byproducts, are inefficient to manufacture, and the dielectric constants are too high.

During the past few years, several types of precursors have been used to manufacture polymers with low dielectric constants for use in manufacture of integrated circuits (IC). Transport Polymerization (TP) and Chemical Vapor Deposition (CVD) methods have been used to deposit low dielectric materials. The starting materials, precursors and end products fall into three groups, based on their chemical compositions. The following examples of these types of precursors and products are taken from Proceedings of the Third International Dielectrics for Ultra Large Scale Integration Multilevel Interconnect Conference (DUMIC), Feb. 10–11 (1997).

I. Modification of $SiO_2$ by Carbon (C) and Fluorine (F)

The first method described is the modification of $SiO_2$ by adding carbon and/or fluorine atoms. McClatchie et al., Proc. 3d Int. DUMIC Conference, 34–40 (1997) used methyl silane ($CH_3$—$SiH_3$) as a carbon source, and when reacted with $SiH_4$, and the oxidant $H_2O_2$ and deposited using a thermal CVD process, the dielectric constant (K) of the resulting polymer was 3.0. However, this K is too high to be suitable for the efficient miniaturization of integrated circuits.

Sugahara et al., Proc. 3d Int. DUMIC Conference, 19–25 (1997) deposited the aromatic precursor, $C_6H_5$—Si—$(OCH_3)_3$ on $SiO_2$ using a plasma enhanced (PE) CVD process that produced a thin film with a dielectric constant K of 3.1. The resulting polymer had only a fair thermal stability (0.9% weight loss at 450° C. in 30 minutes under nitrogen). However, the 30 min heating period is shorter than the tine needed to manufacture complex integrated circuits. Multiple deposition steps, annealing, and metalizing steps significantly increase the time during which a wafer is exposed to high temperatures. Thus, this dielectric material is unsuitable for manufacture of multilevel integrated circuits.

Shimogaki et al., Proc. 3d Int. DUMIC Conference, 189–196 (1997) modified $SiO_2$ using $CF_4$ and $SiH_4$ with $NO_2$ as oxidant in a PECVD process. The process resulted in a polymer with a dielectric constant of 2.6, which is lower than that of $SiO_2$.

However, one would expect low thermal stability due to low bonding energy of $sp^3C$—F and $sp^3C$—Si bonds (BE=110 and 72 kcal/mol., respectively) in the film. The low thermal stability would result in films which could not withstand the long periods at high temperatures necessary for integrated circuit manufacture.

II. Amorphous-Carbon ($\alpha C$)- and Fluorinated Amorphous Carbon (F-$\alpha C$)-Containing Low Dielectric Materials The second approach described involves the manufacture of $\alpha$-carbon and $\alpha$-fluorinated carbon films. Robles et al., Proc. 3d Int. DUMIC Conference, 26–33 (1997) used various combinations of carbon sources including methane, octafluorocyclobutane and acetylene with fluorine sources including $C_2F_6$ and nitrogen trifluoride ($NF_3$) to deposit thin films using a high density plasma (HDP) CVD process.

The fluorinated amorphous carbon products had dielectric constants as low as 2.2 but had very poor thermal stability. These materials shrank as much as 45% after annealing at 350° C. for 30 minutes in nitrogen.

One theory which could account for the low thermal stability of the fluorinated amorphous carbon products is the presence of large numbers of $sp^3C$—F and $sp^3C$—$sp^3C$ bonds in the polymers. These bonds have a bonding energy of 92 kcal/mol. Thus, the films can not withstand the long periods of high temperatures necessary for IC manufacture.

III. Fluorinated Polymers

The third approach described uses fluorinated polymers. Kudo et al., Proc. 3d Int. DUMIC Conference, 85–92 (1997) disclosed polymers made from $C_4F_8$ and $C_2H_2$ with a dielectric constant of 2.4. The polymers had a Tg of 450° C. (Kudo et al., Advanced Metalization and Interconnect Systems for ULSI Applications; Japan Session, 71–75 (1996)).

However, despite its low leakage current due to presence of $sp^3C$—F bonds, a low thermal stability can be expected due to presence of $sp^3C$—F and $sp^3C$—$sp^3C$ bonds in the films. Thus, like the F-$\alpha C$-containing polymers discussed above, these fluorinated polymers are unable to withstand the prolonged high temperatures necessary for IC manufacture.

LaBelle et al, Proc, 3d Int. DUMIC Conference, 98–105 (1997) made $CF_3$—CF(O)—$CF_2$ polymers using a pulsed plasma CVD process, which resulted in a polymer film with a dielectric constant of 1.95. However, in spite of the low K, these polymer films would be expected to have low thermal stability due to presence of $sp^3C$—$sp^3C$ and $sp^3C$—O bonds in these films which have bonding energies of 85 kcal/mol.

Therefore, none of the previously described low dielectric materials have suitably low K and high thermal stability necessary for IC manufacturing.

Wary et al, (*Semiconductor International,* June 1996, 211–216) used the precursor, ($\alpha, \alpha, \alpha^1, \alpha^1$) tetrafluoro-di-p-xylylene) or $\{-CF_2-C_6H_4-CF_2-\}_2$ Parylene AF-4™, which contains a non-fluorinated aromatic moiety, and a thermal CVD process to manufacture Parylene AF-4™ which has the structural formula: $\{-CF_2-C_6H_4-CF_2-\}_n$. Films made from Parylene AF44™ have a dielectric constant of 2.28 and have increased thermal stability compared to the above-mentioned dielectric materials. Under nitrogen atmosphere, a polymer made of Parylene AF-4™ lost only 0.8% of its weight over 3 hours at 450° C.

However, in spite of the advantages of conventional poly(para-xylylenes), there are disadvantages of the known methods of their manufacture. First, the manufacture of their precursors is inefficient because the chemical reactions have low yields, and the process is expensive and produces toxic byproducts. Further, it is difficult to eliminate redimerization of the reactive intermediates. When deposited along with polymers, these dimers decrease the thermal stability and mechanical strength of the film.

Thus, the prior art contains no examples of dielectric material precursors for semiconductor manufacture which have desired properties of low dielectric constant, high thermal stability, and low cost.

SUMMARY OF THE INVENTION

The present invention is directed to overcoming the disadvantages of the prior art.

Accordingly, one object of the invention is to provide precursor materials which can be used to manufacture products including polymers with low dielectric constants for IC manufacture.

Another object of the invention is to provide precursors which can be manufactured into products which have high thermal stability.

Yet another object of the invention is to provide precursors which can be polymerized as thin layers on a substrate.

An additional object of the invention is to provide precursor materials which are inexpensive.

A further object is to provide materials which can be made into products with high efficiency.

An additional object of the invention is to provide precursors which can be made into dielectric materials which can be easily and accurately shaped after manufacture.

The invention includes novel precursors conning a fluorinated silane, a fluorinated siloxane or a fluorocarbon each containing a fluorinated aromatic moiety. The precursors are suitable for making polymers with low dielectric constants and high thermal stability. The polymers can be used for making integrated circuits.

Additionally, the invention includes methods for making polymers for integrated circuit manufacture using novel fluorinated silanes, fluorinated siloxanes, or fluorocarbons, each containing a fluorinated aromatic moiety.

Furthermore, the invention includes integrated circuits comprising low dielectric constant polymers made using fluorinated silanes, fluorinated siloxanes, or fluorocarbons, each containing a fluorinated aromatic moiety.

Accordingly, one aspect of the invention comprises precursors for using in manufacturing polymers with low dielectric constants which are useful in the manufacture of integrated circuits (ICs).

Another aspect of the invention comprises precursors for use in manufacturing polymers with high thermal stability which are useful in the manufacture of ICs.

Another aspect of the invention comprises methods for reacting the precursors and depositing them as thin films on substrates for IC manufacture.

Yet another aspect of the invention comprises the deposited thin film made using the novel precursors and methods for their reaction and deposition.

Another aspect of the invention is the integrated circuits comprised of thin films derived through the reaction and deposition of the novel precursors.

Other objects, aspects and advantages of the invention can be ascertained from the review of the additional detailed disclosure, the examples, the figures and the claims.

BRIEF DESCRIPTION OF THE FIGURES

FIG. 6. Schematic cross-section view of a thin film of this invention made of polymers derived from fluorinated silanes, fluorinated siloxanes, and fluorocarbons.

DETAILED DESCRIPTION OF THE PREFERRED EMBODIMENT

Figure 1:
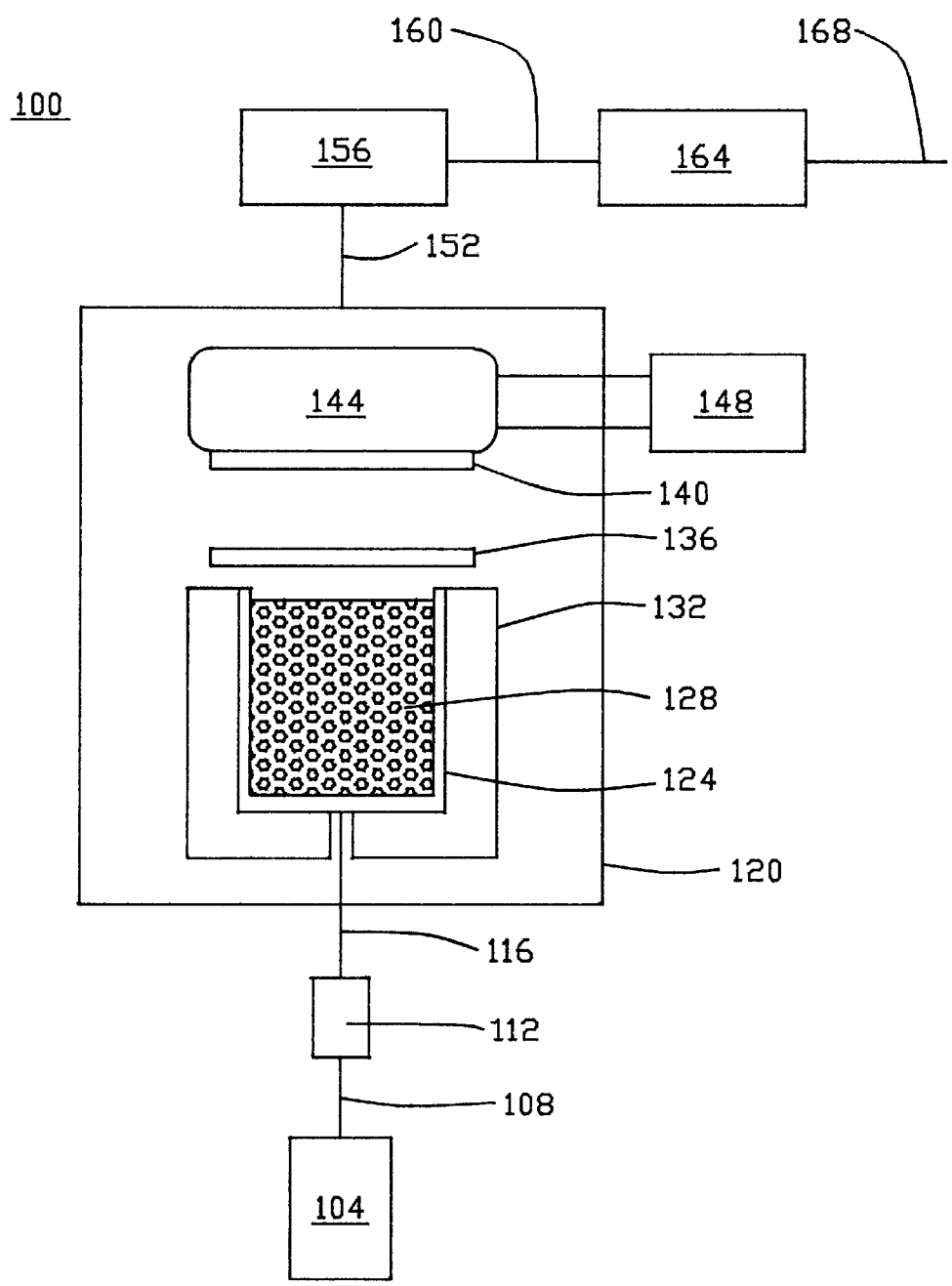
FIG. 1. Embodiment of an apparatus of this invention used for thermolytic transport polymerization of fluorinated silanes, fluorinated siloxanes, and fluorocarbons.

I. Precursors for Making Fluorinated Materials with Low Dielectric Constant

This invention discloses novel precursors for making three categories of fluorine-containing low dielectric materials. These precursors include fluorinated silanes, fluorinated siloxanes, and fluorocarbons. The dielectric materials are useful in the manufacture of semiconductors for integrated circuits and other electronic devices. Manufacture of smaller and faster integrated circuits requires intermetal dielectric (IMD) and interlevel dielectric (ILD) materials which minimize the communication of electrical signals between adjacent conductive lines, referred to as the interconnects. Low dielectric materials are useful to minimize this "crosstalk" within and between layers of integrated circuits.

The polymers prepared from the precursors of the present invention are rigid and contain a high degree of substitution of hydrogen atoms by fluorine atoms. In these polymers, the fluorine in the aromatic ring provides the low dielectric constant (K) below about 3.0 and molecular rigidity. This rigidity is reflected by high glass transition temperature (Tg), temperature of decomposition above about 300° C., high elastic modulus (E) and high shear modulus (G). The elastic modulus is above about 2, and preferably is about 3.

One theory for the thermal stability of the poly(para-xylylenes) is that the higher bonding energies of the $sp^2C=sp^2C$, $sp^2C-H$ and $sp^2C-sp^3C$ bonds of 145, 111 and 102 kcal/mol. respectively. In addition, the $sp^3C-F$ bonds may also be involved in hyperconjugation with sp$^2$C=sp$^2$C double bonds of the adjacent phenylene groups in Parylene AF-4™. This hyperconjugation renders a higher bond energy for the sp$^3$C—F bonds than tat found in non-hyperconjugated sp$^3$C— bonds. (See A. Streitwiesser et al., Introduction to Organic Chemistry, Appendix II, University of California Press, Berkeley, Calif. (1992)) (Table 1).

TABLE 1

Energies of Carbon Bonds In Dielectric Polymers

| | Bond Type: | | | | |
|---|---|---|---|---|---|
| | sp$^3$C-Si | sp$^2$C-Si | sp$^3$C-sp$^3$C | sp$^2$C-H | sp$^2$C-F | sp$^3$C-H |
| Bond Energy (kcal/mol) | 72 | 92 | 92 | 111 | 126 | 86 |

| | Bond Type: | | | | |
|---|---|---|---|---|---|
| | sp$^3$C-O | sp$^2$C-sp$^3$C | sp$^2$=sp$^2$C | sp$^3$C-F | sp$^3$Si-F |
| Bond Energy (kcal/mol) | 85 | 102 | 145 | 110 | 135 |

Thus, carbon atoms bonded to other atoms by with sp$^2$C=sp$^2$C, sp$^2$C—F and hyperconjugated sp$^3$C—F bonds confer advantages to polymers containing tem, whereas other types of bonds (such as sp$^3$C—H and sp$^3$C—C bonds) do not confer these advantages. The sp$^2$C=sp$^2$C and other sp$^2$C bonds increase the mechanical strength and increase Td of the polymer. The presence of fluorine atoms in the aromatic moieties of the polymers of this invention decreases the dielectric constant, and the sp$^2$C—F and hyperconjugated sp$^3$C—F bonds confer greater thermal stability to a polymer containing them. In contrast, polymers which do not contain these types of bonds have lower thermal stability and higher dielectric constant.

As one can see from Table 1, although precursors containing sp$^2$C=sp$^2$C bonds have high thermal stability (bond energy=145 kcal/mol), it is not desirable to use any non-fluorinated compound that consists of these chemical bonds as starting material. Using these non-fluorinated compounds as starting material for PECVD will result in high thermal stability, however, the resulting polymer will also have an high dielectric constant (K>2.5). Therefore, materials with low dielectric constants, high elastic and shear moduli (E and G, respectively) and high thermal stability (Tg and Td) can be obtained only if the fluorinated compounds of this invention are used.

The above conclusions are derived from calculations using an extended "Quasi-Lattice theory" (C. Lee, *JMS Rev. Macromol. Chem. Phys.*, C29(4): 431–560 (1989), incorporated herein fully by reference, and a "topological approach" employed by J. Bicerano, Prediction of Polymer Properties, Second Edition, Marcel Dekker, Inc., New York (1996), incorporated herein fully by reference, indicated that low dielectric constant materials with high thermal stability and high rigidity can be achieved with precursors containing sp$^2$C—F and sp$^2$C bonds.

Although the above calculations using cohesive energy may account for the mechanical and electrical properties of dielectric materials of the present invention, other theories may also explain the observations. Accordingly, the instant invention is not limited to any particular theory which may explain the desired properties of the herein disclosed dielectric precursors.

Therefore, the precursors of this invention contain both single and conjugated double bonds. Additionally, hyperconjugation of sp$^3$C—F with-sp$^2$C bonds results in increased bond strength of the sp$^3$C—F compared to other sp$^3$C—F bonds (such as in polytetrafluoroethylene) which are not hyperconjugated.

However, although precursors which contain double bonded carbon atoms without fluorine (sp$^2$C=sp$^2$C) have desirable Td, Tg, E, and G, the dielectric constant K is too high to be useful in the newer, smaller integrated circuits. Thus, the invention comprises incorporating fluorine atoms bonded to the double bonded carbon atoms in the precursor molecules (sp$^2$C—F) into dielectric materials.

The precursors comprise compounds containing sp$^2$C—F bonds and functional groups which can be cleaved or oxidized using a transport polymerization (TP) or chemical vapor deposition (CVD) process to yield reactive intermediates which spontaneously polymerize on the wafer substrate. Both linearly conjugated polymers and aromatic moieties can be used, but preferred moieties are aromatic. Also preferred are multiple-ring aromatic moieties, and the most preferred are single-ring aromatic moieties such as phenyl rings (e.g., —C$_6$H$_4$—, —C$_6$H$_5$).

A single fluorine atom incorporated into an aromatic moiety decreases the dielectric constant of that moiety, and further Increasing the number of fluorine atoms in the aromatic moiety further decreases K. Thus, the general formula for mono-functional aromatic precursors of the invention is: —C$_6$H$_{5-n}$F$_n$, wherein n is an integer selected from the group of 1, 2, 3, 4 or 5. Similarly, the general formula for di-functional aromatic precursors is: —C$_6$H$_{4-n}$F$_n$—, wherein n is an integer selected from the group of 1, 2, 3 or 4. The most preferred embodiments are aromatic moieties which have maximal substitution of sp$^2$C—H hydrogen atoms by sp$^2$C—F fluorine atoms. Thus, for a precursor containing only one functional group, the mono-fluorinated phenyl group —C$_6$H$_4$F works, but multi-fluorinated phenyl groups are preferred, and —C$_6$F$_5$ is most preferred. For a precursor containing two functional groups, the mono-fluorinated phenyl group —C$_6$H$_3$F— works, but multi-fluorinated phenyl groups are preferred, and —C$_6$F$_4$— is most preferred.

A. Fluorocarbon-Modified SiO$_2$: Fluorinated Silanes and Fluorinated Siloxanes

The first category of precursors consists of precursors for making fluorocarbons, fluorinated silanes and fluorinated siloxane. These precursors are useful for modifying SiO$_2$ by incorporating Si—C bonds, Si—F bonds, and/or fluorinated aromatic bonds. Incorporation of these types of bonded moieties into SiO$_2$ can lower the dielectric constant, but with only small decreases of the Td, Tg, E, and G of the polymers from which they are made.

Precursors of fluorinated silanes in this invention have the general structural formula: (C$_6$H$_{5-n}$F$_n$)$_m$—SiH$_{4-m}$, wherein n is 1, 2, 3, 4 or 5 and n is an integer of 1, 2, 3 or 4. The preferred fluorinated silane of the present invention is C$_6$F$_5$—SiH$_3$.

Precursors of fluorinated siloxanes of this invention have the general structural formula: (C$_6$H$_{5-n}$F$_n$)$_m$—Si(OCH$_3$)$_{4-m}$, wherein n is 1, 2, 3, 4 or 5, and m is 1, 2, or 3. The preferred fluorinated siloxane of the present invention is (C$_6$F$_5$)—Si(OCH$_3$)$_3$.

Precursors of fluorinated hydrocarbons have the general structural formula: CH$_{3-n}$F$_n$—C$_6$H$_{4-p}$F$_p$—CH$_{3-m}$F$_m$, wherein n and m are 1, 2 or 3, and p is 1, 2, 3, or 4. Preferred fluorinated hydrocarbon precursors are CF$_3$—C$_6$F$_4$—CF$_3$ and CHF$_2$—C$_6$F$_4$—CHF$_2$.

There are many isomers with these above general formulas, and all are considered part of the present invention.

TABLE 2

Precursors and Methods for Manufacturing Low Dielectric $SiO_2$ Derivatives

| C & F-source | Si Source | Oxidant | TP and CVD Processes |
|---|---|---|---|
| $C_6F_5$-$SiH_3$ | $SiH_4$ | $H_2O_2$, $NO_2$ | Thermal |
| $C_6F_5$-$Si(OCH_3)_3$ | — | — | Plasma Enhanced |
| $CF_3$-$C_6F_4$-$CF_3$ | $SiH_4$ | — | Plasma Enhanced |

Table 2 shows the precursors, other reactants and TP and CVD processes used to manufacture fluorine-substituted aromatic $SiO_2$ derivatives of this invention. Although the fully fluorinated derivatives are described, mono-, di-, tri-, and tetra-fluorinated aromatic moieties, as appropriate, can also be used.

B. Precursors for Making Fluorinated Amorphous Carbon- and Polymer-Containing Materials with Low Dielectric Constant These precursors consist primarily of $sp^2C$—$sp^2C$, $sp^2C$—F and/or hyperconjugated $sp^3C$—F bonds. Unlike the precursors used for making silanes and siloxanes, no Si source is needed.

Precursors for fluorinated polymers with one aromatic ring and one $sp^2C$—$sp^3C$—F type bond have the general formula: $(C_6H_{5-n}F_n)$—$CH_{3-m}F_m$, where n is an integer of 1, 2, 3, 4, or 5, and m is an integer of 1, 2, or 3. A preferred precursor of a fluorinated polymer is $C_6F_5$—$CF_3$.

Precursors for fluorinated polymers with one aromatic ring and two $sp^2C$—$sp^3C$— F type bonds have the general formula:

$(CH_{3-n}F_n)$—$(C_6H_{4-p}F_p)$—$(CH_{3-n}F_m)$, wherein n and m are integers selected from the group consisting of 1, 2 and 3, and p is an integer selected from the group consisting of 1, 2, 3, and 4. The precursors of fluorinated polymers which are commercially available include $CF_3$—$C_6F_4$–$CF_3$ and $CHF_2$—$C_6F_4$—$CHF_2$.

Precursors of polymers containing one fluorinated aromatic residue and an additional conjugated $sp^2C$ carbon bond have the general structural formula: $(C_6H_{5-n}F_n)$—$CH_{1-m}F_m$=$CH_{2-p}F_p$, where n is an integer of 1, 2, 3, 4, or 5, m is an integer of 0 or 1, and p is an integer of 0, 1, or 2. The preferred precursor of this group is $C_6F_5$—CF=$CF_2$.

There are many isomers with these above general formulas, and all are considered part of the present invention.

TABLE 3

Precursors for Making Low Dielectric Hydrocarbon Polymers

| C & F-sources | Primary α-C Source | TP or CVD Process |
|---|---|---|
| $C_6F_5$-$CF_3$ | $CH_4$ | High Density Plasma |
| $C_6F_5$-CF=$CF_2$ | $CH_4$ | High Density Plasma |
| $HCF_2$-$C_6F_4$-$CF_2H$ | | Thermal or Photon Assisted |
| $CF_3$-$C_6F_4$-$CF_3$ | | Photon Assisted |

II. Deposition of Low Dielectric Materials

The invention comprises new methods and precursors for depositing low dielectric materials. These new methods and precursors have advantages over conventional methods.

During conventional manufacture of semiconductors using spin-on glass (SOG) methods, defects in the dielectric layers can form, especially in locations where there is a channel between metal lines. Such defects in the dielectric layers result in the formation of cracks or "voids" in the dielectric material. These voids and cracks result in trapping moisture, etching gas, or photoresist contaminants and ultimately lead to the degradation and loss of device reliability. Therefore, the present invention provides precursors which can be deposited using chemical vapor deposition (CVD) and transport polymerization (TP) to avoid the problem.

In CVD, a precursor is placed directly on the substrate which will have the thin film of low dielectric material applied. In his "hot chuck" method, the wafer and precursor are exposed to an energy source such as heat, plasma, or electromagnetic radiation to "dissociate" or "crack" the precursor molecule directly on the wafer to form the reactive intermediate. The reactive intermediate molecules then polymerize with each other to form the thin film.

In TP, the cracking step is performed an a chamber other than where the deposition step is performed. This "cold-chuck" method confers several advantages. First, the cracking efficiency can be optimized by selecting appropriate conditions of plasma density, photon energy, or temperature. Second, the density of the intermediate molecules can be regulated to minimize the formation of unwanted side products, such as re-formed precursors. Next, because the wafer is not exposed to the harsh conditions of precursor dissociation, fragile structures containing aluminum or other thermally sensitive materials are less likely to become damaged. Deposition of polymer layers of a few nanometers (nm) to >7000 nm can be achieved, along with eliminating or greatly reducing the number of voids. In principle, layers of polymer of molecular dimensions can be deposited. Thus, the invention provides the novel precursors for the deposition of void-free dielectric films. The type of functional group used determines the optimal type of TP or CVD process should be used. These will be discussed below.

A. General Processes for the Manufacture of Fluorinated Aromatic Derivatives of Silanes and Siloxanes using Thermal Transport Polymerization and Chemical Vapor Deposition For preparations of the low K dielectrics of this embodiment according to the Table 2, the concentration of the fluorinated aromatic silane is in the range of from about 5% to 100%, and is preferably 20%. The fluorinated aromatic siloxane is used in the range of from about 5% to about 100%, and is prep ably 20%. In a plasma enhanced chemical vapor deposition (PECVD) and photon-assisted transport polymerization (TP) processes, no oxidants are required, but in a thermal TP or thermal CVD process an oxidant such as $H_2O_2$ or $NO_2$ is added to oxidize the Si atoms of $SiH_4$ or other silane. Other suitable oxidants are oxygen containing organic or in organic compounds, such as oxalic acid. When $H_2O_2$ is used, its concentration should be in the range of about 10% to about 50%, and is preferably about 30%.

Thermal TP is carried out in a chamber 100 shown in FIG. 1. The precursors are contained within a precursor tank 104, flow through a pipe 108 into a mass flow controller 112 from which they are controllably released through another pipe 116 into the chamber 120 within which is a container 124 with a cracking device that may comprise a catalyst 128. The precursors are heated by a conventional resistive heater 132 to generate the reactive intermediate radicals. Rates of precursor flow range from 0.2 SCCM to 100 SCCM, preferably between 2 and 5 SCCK, and most preferably at 3 SCCM. Temperatures of reactions without catalysts should range from about 700° C. to about 800° C., preferably are in the range of from about 700° C. to about 750° C., and most preferably at about 750° C. For reactions in the presence of catalysts, temperatures can be as low as about 350° C. The pressure in the chamber 120 needed for the cracking reaction should be in the range of about 1 milliTorr to about 500 Torr, and is preferably about 10 milliTorr. After cracking, the intermediates flow to a diffusion plate 136 where the bulk flow is diverted away from the wafer 140. The diffusion plate 136 can be positioned as desired within the chamber, to optimize the pattern of flow of intermediates to the wafer. The intermediates then diffuse to the wafer 140, which is held on a cold chuck 144 which is maintained at a temperature lower than the cracking device by a chiller 148. Temperatures are maintained by any conventional cooling method including liquid nitrogen or reverse Peltier methods. Temperatures of the chuck should be in the range of about −120° C. to about 300° C. are useful, preferred temperatures are in the range of about −40° C. to about 100° C., and the most preferred temperature is about −20° C. The chamber 120 is connected via a pipe 152, to a cold trap 156, and another pipe 160 connects the trap to a pump 156 to maintain low pressure in the chamber 120. The cold trap 156 protects the pump 160 from deposition of precursors and intermediates in the chamber 120.

1. Use of Catalysts in Thermal TP and Thermal CVD

Thermal TP and CVD processes requiring catalysts to dissociate precursor molecules into reactive intermediates can use any conventional catalyst. An ideal catalyst useful for this invention should provide high reactivity, high selectivity, long process life cycle, high recycle capability, and less severe pressure and temperature requirements. It should be inexpensive, safe for human handling, and should be environmentally friendly. The catalyst should crack or cleave the Si—H and crack or oxidize the C—H bonds. Further, the catalyst should not add any metal or metal compound, or reactive ion such as F− into the dielectric film during deposition. Serious reliability problems occur when a metal contaminant resides within the dielectric materials. Other serious problems occur when a highly reactive ion such as F− is introduced into the film. The ion can break interatomic bonds within the hydrocarbon moieties of the dielectric material, resulting in lowered mechanical strength.

Catalysts that are useful for this invention include dehydrogenation catalysts, reforming catalysts, and oxidative dehydration catalysts.

a. Dehydrogenation Catalysts

The temperatures and times needed to complete pyrolysis can be reduced by employing a catalyst in the chamber. An ideal catalyst useful for this invention should provide high reactivity, high selectivity, long process l cycle, high recycle capability, and less severe pressure and temperature requirements. It should be inexpensive, safe for human handling, and should be environmentally friendly. The ideal catalyst should crack or cleave the Si—H and C—H bonds without cracking or cleaving the C—F bonds. Further, the catalyst should not add any metal or metal compound into the dielectric film during deposition. Serious reliability problems occur when a metal contaminant resides within the dielectric materials.

To assist the cracking of the SiH and C—H bonds, any commonly used dehydrogenation catalyst is suitable. These catalysts are also called "protolytic cracking catalysts", or "oxidative dehydrogenation catalysts", in petroleum processing. Additionally, most "dehydrocyclization catalysts" and some of the "aromatization catalysts" for hydrocarbon processing are also useful for this invention, because aromatization normally involves dehydrogenation.

Potassium ferrite ($KFeO_2$) on iron oxide is an example of a suitable catalyst which is commercially available. The ferrite commonly comprises a promoter that may contain a salt of oxide of a Group (IIA) metal, such as Mg, Ca, or Sr, and a Group VB or VIB metal, such as V, Nb, Cr, Mo. or W. [See J. I. Krochiwitz ed., *Encyclopedia of Chemical Technology*, 4th edition, Catalysis and Catalysts, Vol. 5: 320 (1991), incorporated herein fully by reference.] These catalysts can be useful at temperatures up to about 600° C. Variations of these catalysts are BASF's Lu-144F™ and Shell 105™ catalysts, and catalysts for the dehydrogenation of ethylbenzene. These include those produced by Monsanto-Combustion Engineering-Lumis, Union Carbide-Cosden-Badger, and Societe-Chimique des Charbonnages. [See J. J. McKetta, Ed., *Encyclopedia of Chemical Processing and Designs:* Dehydrogenation, Vol. 14:276, Marcel Dekker Inc. (1992), incorporated herein fully by reference.]

Other industrial catalysts include Cu and Zn oxides on alumina and Cu, Ag or Cu—Ag alloy in the form of gauge or as metal deposited on a low surface area support such as kaolin, clay and active carbon. Other supports or carriers can include asbestos, pumice, kiesselguhr, bauxite, $CuO$, $Cr_2O$, $MgCO_3$, $ZrO_2$, and Zeolites. These catalysts are active by virtue of an oxide layer on the metals, and are used for hydrogen generation from methanol. Catalysts consist of copper chromite, bismuth molybdate, iron molybdate, or tin phosphate on similar supports are also useful. [See J. I. Krochiwitz ed., *Encyclopedia of Chemical Technology*, 4th edition, Catalysis and Catalysts, Vol. 5: 320 (1991), incorporated herein fully by reference; J. J. McKetta, Ed., *Encyclopedia of Chemical Processing and Designs:* Dehydrogenation, Vol. 14:276, Marcel Dekker Inc. (1992), incorporated herein fully by reference.]

b. Reforming Catalysts

In addition to dehydrogenation catalysts, reforming catalysts used in petroleum reforming processes can also be used. A first group of these include transition metal Oxides, such as $V_2O_5$, $MoO_3$, $WO_3$ and $Cr_2O_3$ in bulk form or preferred on a non-acid support such as silica, neutral alumina or active carbon. [See Meriaudeau and Naccache, *Cat. Rev.-Eng. Sci.* 39(1&2): 5–48 (1997), incorporated herein fully by reference. Typically useful catalysts include Shell 205™, which consists of 62.5% $Fe_2O_3$, 2.2% $Cr_2O_3$, and 35.3% $K_2CO_3$, and Dow Type B™ catalyst, which consists of calcium and nickel phosphates promoted with a small amount of chromium oxide.

Another group of reforming catalysts useful for dehydrogenation include noble metals on acid supports. The most commonly used catalysts are Pt (0.3 to 0.7%) and Pt/Re on a chlorided (acidified) alumina (e.g., γ- or η-$Al_2O_3$). The bimetallic Pt/Re-alumina is preferred for its longer life time. In addition, Pt, Ga or An modified H-ZSM-5™, or Pt on medium-pore zeolite support such as In-ZSM-5™ is also very effective.

Other, multimetallic reforming catalysts include Pt/Re catalysts of the above including lesser amounts of Ir, Ga, Ge, Sn or Pb supported by chlorided alumina. The catalysts typically have surface areas ranging from 170 $m^2/g$ to 300 $m^2/g$ and pore volumes ranging from 0.45 $cm^3/g$ to 0.65 $cm^3/g$. [See J. L Krochiwitz ed.,. *Encyclopedia of Chemical Technology*, 4th edition, Catalysis and Catalysts, Vol. 5: 320 (1991), incorporated herein fully by reference.] Additionally useful catalysts can also be found in the OJG International refining catalyst compilation-1987 (J. J. McKetta ed., *Encyclopedia of Chemical Processing and Designs:* Petroleum Processing, Catalyst Usage, Vol 35:87–89 Marcel Dekker (1992), incorporated herein fully by reference.] These catalysts comprise active agents such as Pt/ReCl, Ni, PtCl and other rare earth metals on alumina and zeolites.

Other useful catalysts in this invention include (1) noble metals or metal sulfide on active carbon, (2) $Ga_{13}$, $Cr_{12}$, $GaAl_{12}$ & $Al_{13}$ on PILCs, (3) M—$Al_2O_3$ with M=lanthanides, (4) $Al_2O_3$ kneaded with M, where M is Bi & Sb compounded with periodic table Group VIB & VIM metals, (5) M-modified H-ZSM-5 and H-ZSM-11 where M is Zn, Ga, Pt—Ga, Pt—Na, Mo, Cr, K, Ca, Mg, Al, and Group VIII metals, (6) M-modified MFI (H-GalloSilicates) where M is Si/Ga, Na/Ga, Al, (7) rare earth metal exchanged Y-zeolites or ultra stable Y-zeolites, (8) Ti oxide paired with Zr oxide, (9) M plated onto aluminum, where M is Ni, and Ni, Cr, and Al alloys.

Pure dehydrogenations are endothermic by 15 to 35 kcal/g-mol. and hence have high heat requirements. The above catalysts are normally used at temperatures ranging from 300° C. to 600° C. depending on the residence time of the chemicals in the reactor. The effective temperature for some of these catalysts can be lowered by adding free radical initiators such as I, Br, $H_2O$, sulfur compounds or oxygen and their mixtures. However, special care should be taken to avoid reaction of desirable radicals with free radicals generated from these initiators. This can be achieved by providing large mean free paths for these reactants in the reactor, reducing residence time and the adjustment of wafer temperatures to avoid condensation of low mass free radicals.

2. Loss of Catalyst Function

With time, catalysts may lose reactivity due to changing their oxidative state or coke formation. The life time of the catalysts can be increased at high operating temperatures or high partial pressure of hydrogen. If catalysts lose activity by coke accumulation, they can be regenerated by careful oxidation followed by reduction with hydrogen before being returned to service. [See: J. J. McKetta ed., *Encyclopedia of Chemical Processing and Designs:* Catalysis and Catalysts Vol. 6:420; *Petroleum Processing,* Catalyst Usage, Vol 35:89 Marcel Dekker, Inc. (1992), incorporated herein fully by reference.

After leaving the cracking device, the intermediates pass through a diffusion plate to disperse the intermediates evenly over the wafer surface. The intermediates deposit upon the wafer, which is held on a chuck, which, in turn, is connected to a chiller to maintain a temperature of the chuck and wafer below the temperature of the chamber and the intermediates. The temperature of the cold chuck is maintained in the range of about −30° C. to about +20° C., preferably at −20° C. Low pressure in the system is maintained by a vacuum pump with sufficient capacity to maintain the desired pressure within the CVD system. Condensation of precursors and intermediates on the pump is minimized by a trap placed between the deposition chamber and the vacuum pump.

EXAMPLE 1

Thermal CVD of a Fluorinated Silane

The $sp^2C$—F-modified $SiO_2$ thin films can be prepared from thermal oxidation of $C_6F_5$—$SiH_3$. An admixture of 40 mole % of $SiH_4$ and 60 mole % of $C_6F_5$—$SiH_3$ in an aqueous solution with 30% by weight of $H_2O_2$ are dispensed separately through two flash evaporators onto a cold wafer inside a CVD system The molar ratio of $H_2O_2/(SiH_4+C_6F_5$—$SiH_3)$ is about 3.5. The mixtures of $H_2O_2$, $SiH_4$, and $C_6F_5$—$SiH_3$ is chilled as a thin film on the wafer. The wafer is then heated from −20° C. to 500° C. in vacuum at a heating rate of 10° C./mm. The resulting thin film has a dielectric constant of 2.7 and an initial decomposition temperature of 480° C. when tested under nitrogen atmosphere.

B. General Methods for the Manufacture of Low Dielectric Thin Films using Plasma TP or CVD Plasma enhanced TP is carried out generally using methods in the art. Takai et al., *J. Appl. Phys.* 17:399–406 (1984), incorporated herein fully by reference. With low density plasma, the electron density in the plasma is in the range of about $10^{12}$ to about $10^3$ electrons/$cm^3$. Low density plasma TP and CVD can be carried out at about 100 milliTorr to about 100 Torr. High density plasma (HDP) is characterize by electron densities in the range of about $10^{13}$ to about $10^{14}$ electrons/$cm^3$. High density plasma TP and CVD can be carried out at pressures of about 0.1 milliTorr to about 100 milliTorr.

For preparation of the materials with low dielectric constants embodying this invention, reactants such as $SiH_4$, or more generally siloxane such as $Si(OCH_3)_4$ are used. In a thermal CVD process, the presence of oxygen at high temperatures will induce oxidation, resulting in the formation of silicon dioxide ($SiO_2$) films having varying K based on varying the relative compositions of $SiO_2$ and $sp^2C$—F bonded molecules.

Figure 2:
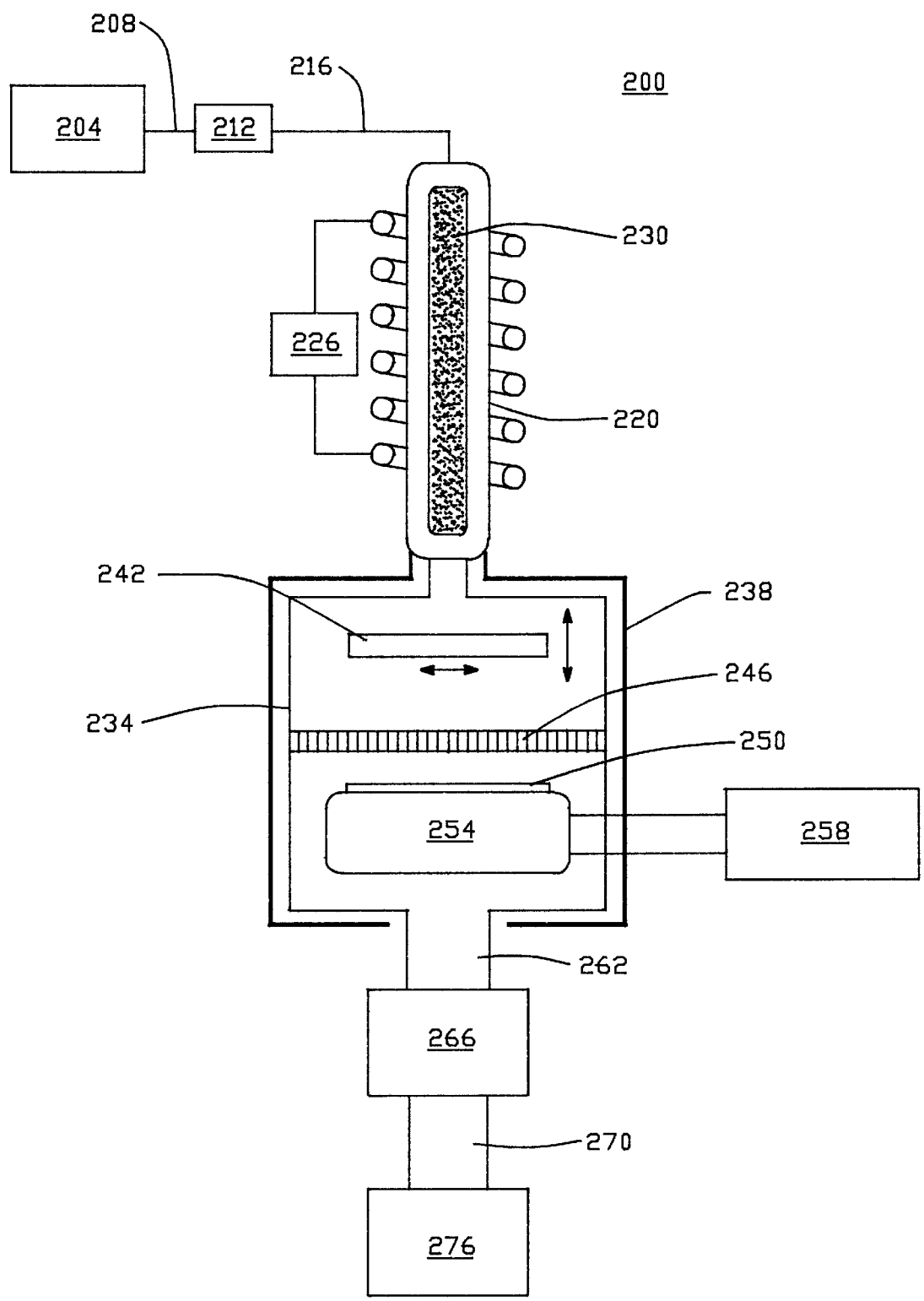
FIG. 2. Embodiment of an apparatus of this invention used for radio frequency plasma enhanced transport polymerization of fluorinated silanes, fluorinated siloxanes, and fluorocarbons.

1. Plasma Enhanced Transport Polymerization of Fluorinated Silanes and Fluorinated Siloxanes To make thin films, $sp^2C$—F-containing starting materials such as $(C_6H_{5-n}F_n)_m$—$Si(OCH_3)_{4-m}$ wherein n is an integer of 1, 2, 3, 4, or 5, and m is an integer of 1, 2, or 3, $(C_6H_{5-n}F_n)_m$—$SiH_{4-m}$ wherein n is an integer of 1, 2, 3, 4, or 5, and m is an integer of 1, 2, 3, or 4, $C_6F_5$—$CF_3$, or admixtures of these staring materials are delivered into a plasma enhanced transport system 200 depicted in FIG. 2. Precursors are stored in a precursor holder 204. A carrier gas, typically helium, is passed through a bubbling device to volatilize the precursor. The vaporized precursors flow through a pipe 208 and to a mass flow controller 212. The mass flow controller (MFC) provides a precursor feed rate ranging from about 0.2 to about 500 standard cubic centimeter per minute (SCCM). The precursors flow from the MFC 212 through a pipe 216 and into a quartz tube 220 under low pressures in the range of from about 0.1 milliTorr to 10 Torr, and preferably in the range from about 1 milliTorr to about 3 milliTorr. A carbon source such as $CH_4$ or $C_2H_2$ is provided via a second feeder (not shown) and a second MFC (not shown) with a feed rate ranging from 0 to 500 SCCM. The preferred flow rates of precursor into the plasma tube should be in the range of from about 0.2 SCCM to about 10 SCCM, and is most preferably in the range of about 0.5 SCCM to about 1 SCCM.

Pyrolization takes place within the quartz tube by action of a radiofrequency (RF) plasma generator 226. Effective plasma 230 can be maintained by radio frequencies in a range of between about 1 kHz and 2.5 GHz. A preferred range is between about 400 KHz and about 13.56 MHz. Ideally, the RF frequency is about 13.56 MHz. The RF power should be in the range of about 30 Watts to 300 Watts, preferably about 100 Watts to 250 Watts, and more preferably about 200 Watts.

The plasma 230 then proceeds into the deposition chamber 234 which is heated by a heater 238 to prevent deposition of precursor intermediates on the chamber walls. The pressure within the chamber 230 is maintained at a pressure between about 0.1 milliTorr and about 10 Torr. The flow of plasma is adjusted by a flow pattern adjuster 242, which can be moved within the chamber. Moving the flow pattern adjuster 242 in the vertical direction adjusts the flow rate and distribution pattern of the plasma as it enters the chamber. Moving the flow pattern adjuster in the horizontal direction adjusts the distribution of plasma to different parts of the wafer 250. A gas dispersion plate 246 evens the delivery of the intermediates to the wafer 250. The wafer 250 is cooled by the chuck 254, which is cooled by liquid nitrogen, reverse Peltier effect, or other conventional cooling device 258, and is maintained at a temperature in the range of about −30° C. to about +20° C., and is preferably about −10° C. The deposition chamber 224 is connected via a pipe 262 to a cryogenic trap 266, which is connected via a pipe 270 to a pump 276, which maintains the pressure within he chamber at the desired level.

2. High Density Plasma Chemical Vapor Deposition

A high density plasma deposition process can also be used to dissociate precursors. In contrast to the low density plasma process described above, in high density plasmas, the electron density is in the range of from about $10^{13}$ to $10^{14}$ electrons/cm$^3$. This process must be carried at lower pressures than conventional plasma processes. In this embodiment, a inductively coupled high density plasma apparatus 300 is shown schematically in FIG. 3. A precursor delivery'system 304 volatilizes or vaporizes the precursor, which flows through a pipe 308 and an anode gas injector 312 into the deposition chamber 316. The anode gas injector 312 is attached to RF generators 320 which are matched by matching controllers 324. The output of the RF generators 320 passes through inductive coils 328 to produce an electrical field. The wafer 332 is held by a cathode electrostatic chuck 336, which is connected to the RF generator 320. IR sources 340 provide additional heating of precursors to decrease the needed plasma power and to inhibit condensation of materials on the walls of the chambers. The plasma source power needed for a wafer of 8 inch diameter is in the range of about 100 Watts to 4000 Watts, and preferably about 2000 Watts. For wafer of other sizes, the power should be adjusted accordingly. Power should range from about 1 Watt/cm$^2$ wafer surface area to about 15 Watts/cm$^2$, preferably from about 2 Watts/cm$^2$ to about 10 Watts/cm$^2$, and most preferably about 5 Watts/cm$^2$. The chamber pressure is maintained in the range of 0.01 milliTorr to 10 milliTorr, and preferably below 5 milliTorr. The wafer temperature is in the range from about 300° C. to 450° C., and is preferably about 350° C.

Generally, thin films made using plasma methods contain lower carbon content than films made using thermal methods. Films with decreased carbon content are made using greater plasma power. One theory to account for this is that increasing the plasma power increases the dissociation of the precursors by more completely cracking the precursors. Decreasing the carbon content of films decreases the trapping of electrons in the film, and leads to more reliable, long lasting devices.

The deposition rate can be regulated by adjusting the flow rate of precursors into the plasma generator and thereby adjusting the flow rate of reactive intermediates over the wafer. However, as the precursor flow rate increases, the residence time within the plasma generator decreases, and this can result in less complete cracking. To overcome this problem, it is desirable to increase the plasma power as the precursor flow rate increases. This maintains the efficiency of the cracking reaction.

If desired, further increases in the efficiency of the plasma reactions can be achieved by heating the chamber. This can be done using a conventional resistive heater or using an infrared (IR) heater. Preferably, IR irradiation is used, and the wavelength of the IR radiation is chosen to maximal absorption by the precursor.

The above reaction is designed to accommodate wafers with diameters of about 200 mm. Thin films of this invention are deposited at a rate of about 1000 Å/min. Films deposited using this system have dielectric constants of 2.3 to 3.5, and have Td in the range of about 350° C. to 500° C., depending on the fluorine content Increasing the fluorine content decreases the dielectric constant The thin films have no initial weight loss; Td and Tg are temperatures ranging from 450° C. to 500° C. under nitrogen atmosphere.

EXAMPLE 2

Figure 3:
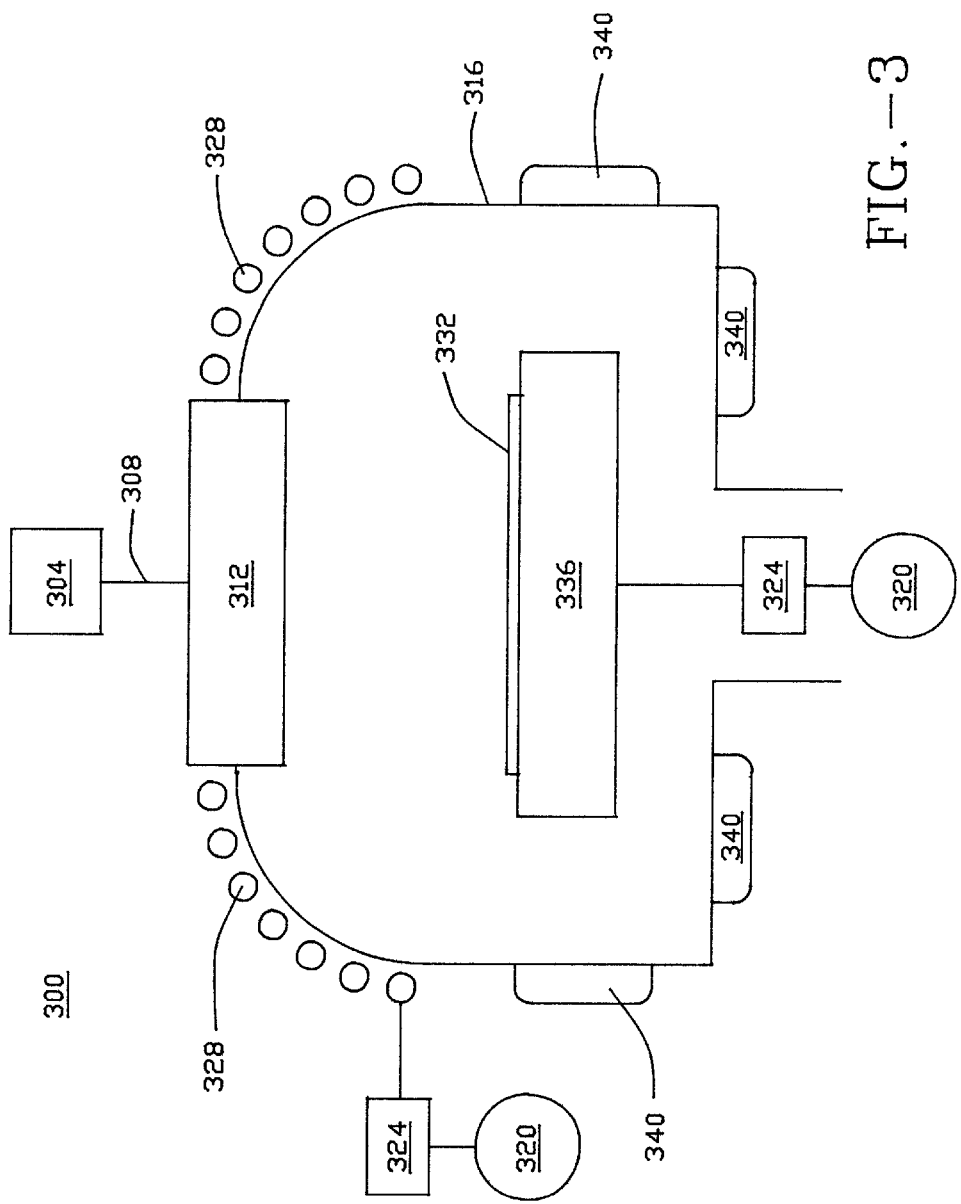
FIG. 3. Embodiment of an apparatus of this invention used for high density plasma enhanced chemical vapor deposition of fluorinated silanes, fluorinated siloxanes, and fluorocarbons.

Manufacture of a Thin Film Low Dielectric Layer Using Plasma Enhanced Transport Polymerization A thin film of $C_6F_5$—Si(OCH$_3$)$_3$ is made using a parallel type of plasma reactor as depicted in FIG. 3. The compound is delivered into the chamber employing a bubbling device using Ar as a carrier gas. The compound is introduced at a feed rate of 50 SCCM. The operating chamber pressure is 20 milliTorr. Effective plasma is maintained by an RF frequency of 13.56 MHz at a power of 1.3 Watts/cm$^2$ applied to the upper electrode with a wafer placed on the lower electrode which is grounded. The wafer temperature is maintained at 400° C. The thin film made by this process has a dielectric constant of 2.65, and has no initial weight lass at 500° C. under nitrogen atmosphere.

C. General Methods for the Manufacture of Low Dielectric Thin Films using Photon Assisted Transport Polymerization In addition to thermally and plasma-generated reactive intermediates, photon assisted precursor cracking is also part of this invention. Because specific chemical bonds have specific energies, and because these energies can be supplied as photons, electromagnetic radiation is a preferred method of practicing this invention.

Figure 4:
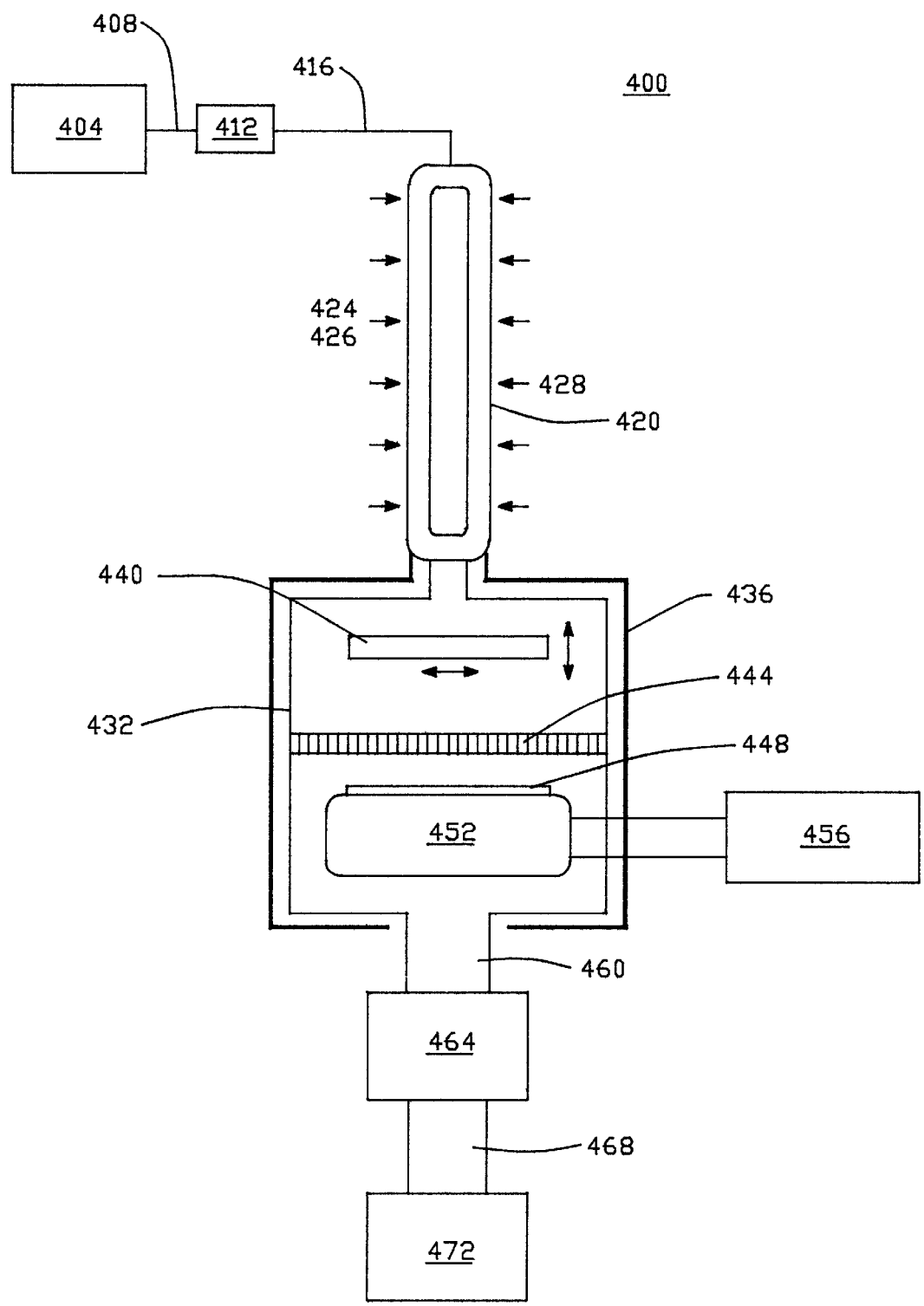
FIG. 4. Embodiment of an apparatus of this invention used for photon assisted transport polymerization of fluorinated silanes, fluorinated siloxanes, and fluorocarbons.

A transport polymerization system 400 using electromagnetic radiation is shown in FIG. 4. Precursors are stored in a precursor tank 404 and then flow through a pipe 408 to a mass flow controller 412, where the precursor flow rate is regulated. Volatile precursor then passes through pipe 416 into a transparent tube 426. For UV photolytic cracking of the precursor, tube 420 is made of quartz, preferably a single quartz crystal. For infrared (IR) cracking of the precursor, tube 420 may be made of glass. For vacuum ultraviolet photolytic cracking of the precursor, tube 420 is made of MgF$_2$, LiF, or CaF$_2$. An ultraviolet (UW) source 424 is used to photolytically dissociate the precursor. Alternatively, a vacuum ultraviolet (VUV) 426 source can be used. An infrared (IR) source 428 can be used, which heats the precursors to provide a combination of thermolytic and photolytic cracking. After cracking, the intermediates pass into the deposition chamber 432, which is heated by a resistive heater 436 to prevent deposition of intermediates on the wills of chamber 432. The flow of intermediates is adjusted using flow pattern adjuster 440. Moving the flow pattern adjuster 440 in the vertical direction adjusts the flow rate of and the distribution pattern of intermediates in the deposition chamber 432. Moving the flow pattern adjuster 440 in the horizontal direction adjusts the distribution pattern of intermediates in the deposition chamber 432. A gas dispersion plate 444 evens the delivery of the intermediates to the wafer 448. The wafer 448 is held by a cold chuck 452, which is maintained at low temperatures by a conventional cooling device, using liquid nitrogen, reverse Peltier effect, or any other cooling apparatus known in the art. The chamber 432 is connected via a pipe 460 to a trap 464, which is connected via another pipe 468 to a pump 472. The pump maintains the pressure within the deposition chamber 432 at the desired level, and the trap 464 minimizes the deposition of intermediates on the pump 472.

Using the photolytic method, the dissociation reaction can be very selective and efficient if appropriate photon sources are used. The photon sources can be provided by ultraviolet (UV) light generated by mercury vapor discharge or metal halide lamps. Exemplary sources of UV radiation for transport polymerization can include (1) a mercury lamp that provides from 50 to 220 mWatts/cm$^2$ of UV ranging from 200 to 450 nm or (2) a metal halide lamp that provides from 40 to 160 mWatts/cm$^2$ of UV ranging from 260 nm to 450 run. These UV sources provide photon energies ranging from 2 to 5 eV, which are sufficient for generating many radical intermediates.

An alternative to conventional UV light is vacuum ultraviolet (VUV). Incoherent excimer radiation can provide a large number of UV and VUV wavelengths for photolytic processing of various chemicals. The preferred source is incoherent excimer radiation derived from dielectric barrier discharge. UV and VUV photons that are in the ranges of 3 to 5 eV are especially useful. These energy levels are comparable with the bonding energies of most chemical bonds, thus are very effective for initiating photochemical reactions (see Table 4).

TABLE 4

Bond Energies of Selected Bonds

| Chemical Bonds | Bonding Energies (eV) |
| --- | --- |
| φ-CH$_2$-Br | 2.52 |
| φ-CH$_2$-OR | 3.52 |
| φ-CH$_2$-CH$_3$ | 3.30 |
| φ-CH$_2$-NH | 3.09 |
| φ-CH$_2$-F | 4.17 |
| φ-CH$_2$-SR | 3.20 |
| φ-CH$_2$-H | 3.83 |

Table 4 shows the bonding energies in electron volts (eV) corresponding to certain bonds of this invention. This data is from Streitwiesser et al., Introduction to Organic Chemistry, Appendix II, University of California Press, Berkeley, Calif. (1992), incorporated herein fully by reference.

However, the energies of mercury vapor or metal halide UV radiation are too small to be useful for rapid transport polymerization. The desired residence time within the cracking chamber, which is the time available for photolysis should be in the range of a few milliseconds to several hundred milliseconds. Therefore, VUV is the most desirable form of energy for photon assisted transport polymerization.

VUV or incoherent excimer UV sources can be provided by dielectric barrier or silent discharge. For example, VUV can be generated using KrBr, Ar$_2$, ArCl, ArBr, Xe$_2$ and F$_2$ gases. Xe emits at 172 nm, Kr at 222 nm, and XeCl emits at 308 nm. As can be seen from Table 2, nearly all of the chemical bonds of interest in polymer manufacture can be broken using photolytic methods. Because excimer radiation is selective for the energy of the specific bonds, excimer radiation from another source or plasma may be used simultaneously if it is desired to break other bonds at the same time. Such a combination of excimer and plasma sources are useful to break bonds of precursors of cross-linked poly(para-xylylenes). Because the leaving groups of these precursors may be different, it is desirable to break those bonds selectively to generate tri- and tetra-functional reactive intermediates.

When IR incoherent excimer irradiation is used, the conventional stainless steel or ceramic pipe or reactor used in the pyrolyzer will have to be replaced with a quartz tube or reactor. When using UV, the transparent tube shown in FIG. 4 can be made of any UV transparent material such as quartz, preferably a single quartz crystal. When using VUV, the transparent tube must be made of a material transparent to VUV wavelengths. Crystals of MgF$_2$, LiF, or CaF$_2$ are preferred.

TABLE 5

Operating Conditions for Photon Assisted Dissociation of Precursors

| Variable | Range | Preferred Range |
| --- | --- | --- |
| Photon Wavelength | 100–400 nm | 140–300 nm |
| Photon Energy | 2.5–12 eV | 4–9 eV |
| Photon Flux | 5 mW/cm$^2$–10 W/cm$^2$ | 40–100 mW/cm$^2$ |
| Reaction Chamber Pressure | 0.1 milliTorr–10 Torr | 1–100 milliTorr |
| Reaction Chamber Temperature | −20–300° C. | 30–100° C. |
| Deposition Chamber Temperature | −30 to +20° C. | −10° C. |
| Deposition Chamber Pressure | 0.1 milliTorr–10 Torr | 1–100 milliTorr |

In one embodiment of this invention, photon assisted dissociation occurs immediately above the wafer surface onto which the film is to be deposited. Because no transport of intermediates is needed, the efficiency of deposition is increased. Further, the photon energy or mixtures of photon energy (from mixed excimer gases) could be made to both dissociate the precursor as well as promote nucleation and adhesion of the polymer based films.

D. General Methods for the Manufacture of Low Dielectric Thin Films Using Photon-Plasma Assisted Precursor Dissociation and Deposition Additionally, a combined photon-plasma process is used for dissociation of precursors and deposition of thin films of low dielectric materials. Photon energy is used to generate a plasma in certain gases. In this embodiment of the invention, the attributes of plasma, generally high rates of dissociation, along with the cool photon energy source, provides a unique method for both precursor dissociation and even film deposition. Additionally, infrared (IR) radiation can be used to heat reactor elements and precursors. Pre-heating precursors increases the efficiency of photon and plasma dissociation of the precursors. Moreover, the photon plasma can be directed toward the surface on which films are being deposited.

Figure 5:
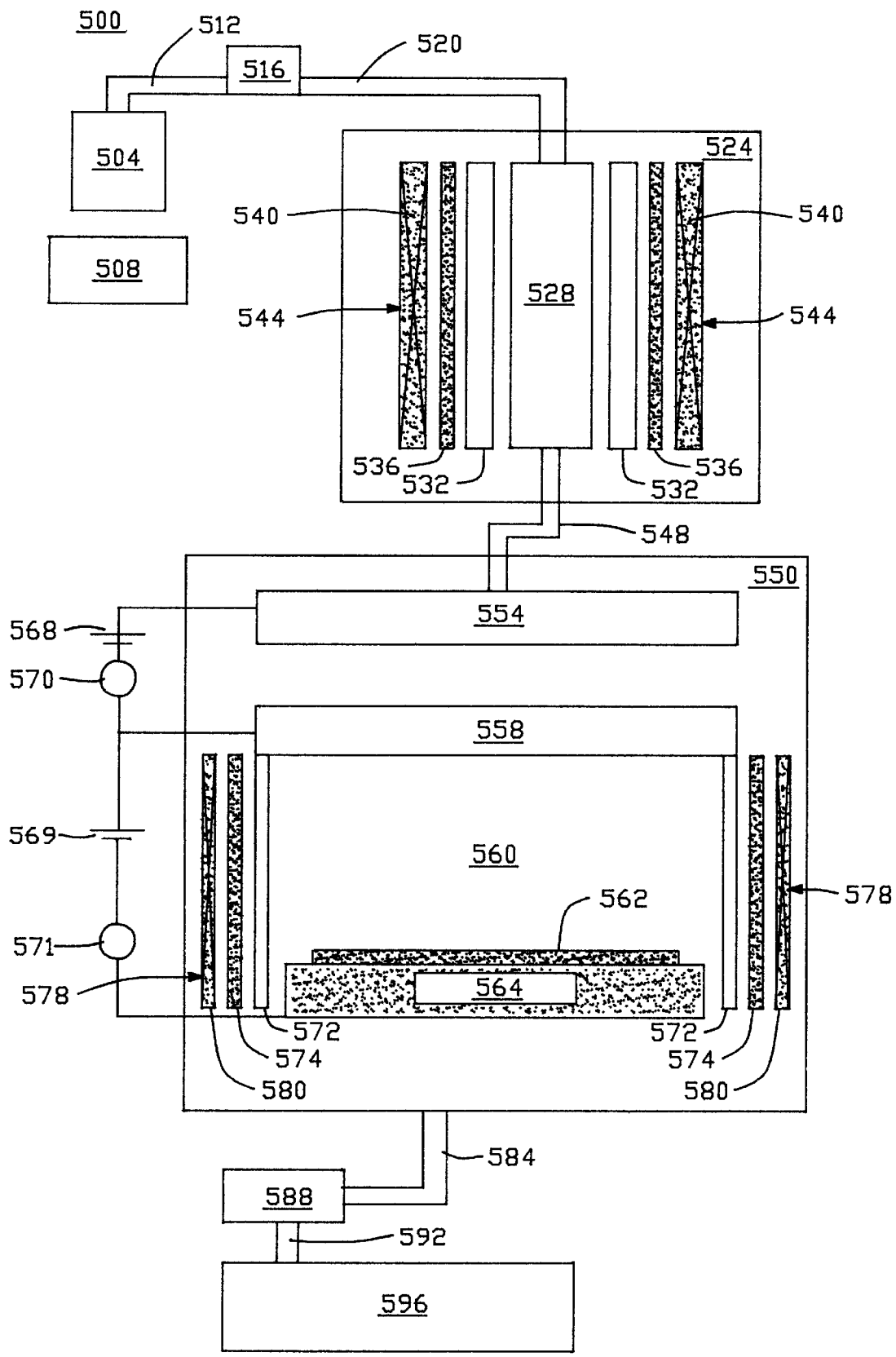
FIG. 5. Embodiment of a universal deposition system of this invention for deposition of fluorinated silanes, fluorinated siloxanes, and fluorocarbons.

FIG. 5 depicts a schematic diagram of a TP and CVD reactor 500 embodying the elements for photon-plasma and IR dissociation and deposition. Precursors 504 are stored in a precursor container 508 which is connected via a pipe 512 to a mass flow controller 516. For TP, precursors are transported into a dissociation reactor 524 which houses the dissociation chamber 528. The wall of reactor 524 is made of crystalline materials such as LiF, MgF$_2$, or CaF$_2$, which permits light of vacuum ultraviolet wavelengths to pass. Vacuum ultraviolet and ultraviolet light is generated by a silent discharge plasma generators 532, which are place inside infrared heaters 536. The infrared heaters 536 are placed inside DC magnets 540 and AC magnets 544. The magnets regulate the flow of plasma during dissociation, and the reactive intermediates so generated are transported to a deposition reactor 550.

The deposition reactor 550 contains a deposition chamber 560 containing a gas and reactant dispersion manifold 554, a gas and reactant dispersion plate 558. The walls of the deposition chamber are made of crystalline materials such as LiF, $MgF_2$, or $CaF_2$, which permits light of vacuum ultraviolet wavelengths to pass. The gas dispersion manifold 554 and the gas dispersion plate 558, are used to adjust the distribution and homogeneity of the intermediates. The intermediates are directed toward the wafer 562, which is held on a cold chuck 564. The gas dispersion manifold 554 and dispersion plate 558 are connected in parallel to a DC voltage bias anode 568, a DC voltage bias cathode 569, an AC voltage bias anode 570, and an AC voltage bias cathode 571. Silent discharge plasma generators 572 are placed outside the deposition chamber 560. Infrared heaters 574 are placed outside the silent plasma discharge generators 560 and DC magnets 578 and AC magnets 580 are placed outside the infrared heaters 574. Gases exit the deposition chamber 560 through a pipe 584, pass through a cold or reactive trap 588, pass through another pipe 592 to a vacuum pump 596. The pressure in the systems is maintained at a desired pressure using pump 596. The trap 588 protects the pump from deposition of intermediates.

For CVD, the deposition chamber can be used without the dissociation reactor. Precursors are placed directly on wafer 562, and the chuck 564 is not cooled. IR, UV, or VUV radiation is directed toward the wafer 562. The radiation dissociates the precursor, and deposition of intermediates and polymerization takes place on the wafer.

Table 6 shows process conditions for combined photon-plasma assisted precursor dissociation using chamber 528, and Table 7 shows process conditions for combined photon-plasma precursor deposition in chamber 560.

TABLE 6

Process Conditions for Photon-Plasma Precursor Dissociation

| Variable | Range | Preferred Range |
| --- | --- | --- |
| Temperature | 200° C.–600° C. | 350° C.–500° C. |
| Photon Wavelength | 100 nm–400 nm | 140 nm–300 nm |
| Photon Energy | 2.5 eV–12 eV | 4 eV–9 eV |
| Photon Flux | 10 milliW/$cm^2$–5 W/$cm^2$ | 40–100 milliW/$cm^2$ |
| Plasma Density | $10^{12}$–$10^{14}$ elections/$cm^3$ | $10^{13}$ electrons/$cm^3$ |
| Pressure | 0.1 milliTorr–10 Torr | 1 milliTorr–10 milliTorr |

TABLE 7

Process Conditions for Photon-Plasma Precursor Deposition

| Variable | Range | Preferred Range |
| --- | --- | --- |
| Temperature | −20° C.–300° C. | −10° C. |
| Photon Wavelength | 100 nm–400 nm | 250 nm |
| Photon Energy | 2.5 eV–12 eV | 4.5 eV |
| Photon Flux | 10 milliW/$cm^2$–5 W/$cm^2$ | 10–100 milliW/$cm^2$ |
| Plasma Density | $10^{12}$–$10^{14}$ electrons/$cm^3$ | $10^{13}$ electrons/$cm^3$ |

TABLE 7-continued

Process Conditions for Photon-Plasma Precursor Deposition

| Variable | Range | Preferred Range |
| --- | --- | --- |
| Pressure | 0.1 milliTorr–10 Torr | 1 milliTorr–10 milliTorr |

In Tables 6 and 7, the plasma density is reported as electron density, but it is to be noted that ion density must be the same to maintain charge neutrality of the plasma. Any non-uniformity of charge distribution can result in plasma damage to the thin film of low dielectric material, as well as imparting charge to the integrated circuit components.

Control of the plasma is by a magnetic field within the precursor chamber and in the deposition chamber. In the precursor reactor, the plasma is confined to any desired area, such as the center of the reactor. Additionally, by alternating the polarity of the magnetic field stirs the plasma, ensuring even energy distribution within the plasma, thereby increasing the efficiency of dissociation of precursor molecules into reactive intermediates. In the deposition chamber, the magnetic field is used to control the pattern of distribution of intermediates over the wafer. This would serve two purposes: (1) to direct the deposition of precursor to the desired portion of the surface, thus conserving the precursor, and (2) minimize film deposition on other parts of the reactor chamber, thus minimizing the required cleaning, mining particle generation, and simplifying the reactor chamber design.

Another feature comprises the placement of an electrical bias voltage within the deposition chamber. This provides a further means of controlling the flow of plasma-ionized species to the site of deposition on the wafer. A bias voltage, in the form of direct current (DC) or alternating current (AC) can be applied and modulated. Pulsed voltages can be used to alter the flow pattern of ions to either accelerate, decelerate, or to regulate the density of the plasma ions in the stream reaching the wafer. Optimization of ion velocity and flow, thus can be obtained using various combinations of magnetic field and bias voltage.

TABLE 8

Optimization of Electrical and Magnetic Field Variables

| Variable | Range | Preferred Range |
| --- | --- | --- |
| DC Bias Voltage | 100– 2000 V | 500 V |
| AC Bias Voltage | 10– 200 V | 50 V |
| Pulsed Bias Voltage | 100– 4000 V | 500 V |
| Pulse Width | 10– 1000 msec | 1 msec |
| Pulse Frequency | 10 Hz– 1000 Hz | 60 Hz |
| DC Magnetic Field Strength | 100– 2000 Gauss | 700 Gauss |
| AC Magnetic Field Strength | 100– 1000 Gauss | 500 Gauss |
| AC frequency | 10 Hz– 500 Hz | 50 Hz–60 Hz |

Table 8 shows the ranges of the various magnetic field and bias voltage variables which are regulated in this invention.

Other reactors and reactor configurations may be used, as exemplified by the above cited co-pending applications incorporated herein fully by reference.

The low dielectric constant materials are polymerized into thin films of thicknesses of about 500 Å to about 5 μm on wafers for use in the manufacture of integrated circuits. FIG. 6 depicts a diagram of a multi-level integrated circuit chip 600 embodying the features of this invention. The substrate 604 has a source region 608, a drain region 612, and a polysilicon gate 616. A first interlevel dielectric (ILD) layer 620 overlays the substrate 600 and polysilicate gate 616. The wafer is subsequently planarized using chemical mechanical polishing another method known in the art. A floating polysilicon gate 624 is overlain by a second ILD layer 628. The wafer is again planarized, a first metal line 632 and a first intermetal dielectric (IMD) layer 636 are deposited. The wafer is again polished. On top of the IMD layer 636, a third metal line 640 and a second ILD layer 644 is deposited. The wafer is again planarized.

It should be appreciated by those of ordinary skill in the art that other embodiments may incorporate the concepts, methods, precursors, polymers, films, and devices of the above description and examples. The description and examples contained herein are not intended to limit the scope of the invention, but are included for illustration purposes only. It is to be understood that other embodiments of the invention can be developed and fall within the spirit and scope of the invention and claims.

Other features, aspects and objects of the invention can be obtained from a review of the figures and the claims.

Industrial Applicability

The invention includes novel precursors containing a fluorinated silane, fluorinated siloxane and fluorocarbons, each containing a fluorinated aromatic moiety. The precursors are suitable for making polymers with low dielectric constants and high thermal stability.

Additionally, the invention includes methods for making polymers for integrated circuit manufacture using novel fluorinated siloxanes, fluorocarbons, and fluorinated aromatic moieties.

Furthermore, the invention includes integrated circuits made using fluorinated siloxanes, fluorocarbons, or fluorinated aromatic moieties, with low dielectric constants.

According to the present invention, the polymers made from the disclosed precursors have low dielectric constant and high thermal stability. Therefore, integrated circuits made from these precursors have improved electrical and mechanical properties.

What is claimed is:

1. A method for making a film comprising the steps of:
   selecting a non-dimer precursor comprising at least one of a $sp^2C$—F bond and a hyperconjugated $sp^3C$—F bond; and
   processing the precursor in at least one of a transport polymerization (TP) process and chemical vapor deposition (CVD) process, wherein the process is selected from the group consisting of thermal process, a plasma enhanced process, a high density plasma process, a photon assisted process and a photon-plasma assisted process in order to deposit the film.

2. The method of claim 1 wherein the step of selecting includes selecting a precursor comprising a fluorinated aromatic moiety.

3. The method of claim 1 wherein the step of selecting includes selecting a precursor comprising $(C_6H_{5-n}F_n)_m$—$SiH_{4-m}$, wherein n is an integer selected from the group consisting of 1, 2, 3, 4 and 5 and m is an integer selected from the group consisting of 1, 2, 3 and 4, and the processing step includes processing the precursor in a thermal CVD process with a primary Si source of $SiH_4$.

4. The method of claim 1 wherein the step of selecting includes selecting a precursor comprising $(C_6H_{5-n}F_nF_n)_m$—$Si(OCH_3)_{4-m}$, wherein n is an integer selected from the group consisting of 1, 2, 3, 4 and 5, and m is an integer selected from the group consisting of 1, 2 and 3, and the processing step includes processing the precursor in a plasma enhanced CVD process.

5. The method of claim 1 wherein the step of selecting includes selecting a precursor comprising $CH_{3-n}F_n$—$C_6F_4$—$CH_{3-m}F_m$ wherein n and m are integers selected from the group consisting of 1, 2, and 3, and the processing step includes processing the precursor using a plasma enhanced CVD process with a primary Si source of $SiH_4$.

6. The method of claim 3 wherein the processing step further comprises using an oxidant.

7. The method of claim 1 wherein the step of selecting includes selecting at least one of a silane and a siloxane and the processing step includes processing the precursor using a plasma enhanced CVD process.

8. The method of claim 1 wherein the step of selecting includes selecting one of a silane and a siloxane.

9. The method of claim 1 wherein the step of selecting includes selecting a silane and the processing step includes processing the precursor in a thermal CVD process.

10. The method of claim 9, wherein the processing step further comprises using an oxidant.

11. The method of claim 1 wherein the step of selecting includes selecting a precursor comprising $(C_6F_5)_n$—$CF_{4-n}$ wherein n is an integer selected from the group consisting of 1, 2, and 3, and the processing step includes processing the precursor in a high density plasma CVD process.

12. The method of claim 9, wherein the processing step includes a hydrocarbon as a primary carbon source.

13. The method of claim 9, wherein the processing step includes using $CH_4$ as a primary carbon source.

14. The method of claim 1 wherein the step of selecting includes selecting a precursor comprising $C_6F_5$—$CF=CF_2$ and the processing step includes processing the precursor in a high density plasma CVD process.

15. The method of claim 14, wherein the processing step includes using a hydrocarbon as a primary carbon source.

16. The method of claim 14, wherein the processing step includes using $CH_4$ as a primary carbon source.

17. The method of claim 1 wherein the step of selecting includes selecting a precursor comprising $(CH_{3-n}F_n)$—$(C_6H_{4-p}F_p)$—$(CH_{3-m}F_m)$, wherein n and m are integers selected from the group consisting of 1, 2, and 3, p is an integer selected from the group consisting of 0, 1, 2, 3, and 4, and the processing step includes processing the precursor in one of a thermal and a photon assisted CVD process.

18. The method of claim 1 wherein the step of selecting includes selecting a precursor comprising $CF_3$—$C_6F_4$—$CF_3$ and the processing step includes processing the precursor in a photon assisted CVD process.

19. The method of claim 1 wherein the step of selecting includes selecting a mixture of at least two different precursors at least one of which comprises a $sp^2C$—F bond.

20. The method of claim 1, wherein the processing step deposits a film having a dielectric constant below about 3.0, an elastic modulus from about 2 up to about 3, and a temperature of decomposition above about 300° C.

21. The method of claim 6 wherein the oxidant is selected from the group consisting of $NO_2$ and $H_2O_2$.

22. The method of claim 10 wherein the oxidant is selected from the group consisting of $NO_2$ and $H_2O_2$.

23. The method of claim 3, wherein the step of selecting includes selecting $C_6F_5$—$SiH_3$.

24. The method of claim 3, wherein the step of selecting includes selecting $(C_6F_5)_2$—$SiH_2$.

25. The method of claim 3, wherein the step of selecting includes selecting $(C_6F_5)_3$—$SiH$.

26. The method of claim 4, wherein the step of selecting includes selecting $C_6F_5$—$Si(OCH_3)_3$.

27. The method of claim 4, wherein the step of selecting includes selecting $(C_6F_5)_2$—$Si(OCH_3)_2$.

28. The method of claim 4, wherein the step of selecting includes selecting $(C_6F_5)_3$ hd 3.

29. The method of claim 5, wherein the step of selecting includes selecting $CHF_2$—$C_6F_4$—$CHF_2$.

30. The method of claim 5, wherein the step of selecting includes selecting $CH_2F$—$C_6F_4$—$CH_2F$.

31. The method of claim 1 wherein the step of selecting includes selecting a precursor comprising $CH_{3-n}F_n$—$C_6F_4$—$CH_{3-m}F_m$ wherein n and m are integers selected from the group consisting of 1, 2, and 3, and the processing step includes processing the precursor using a plasma enhanced CVD process.

32. The method of claim 1 wherein the step of selecting includes selecting a precursor comprising $(CH_{3-n}F_n)$—$(C_6H_{4-p}F_p)$—$(CH_{3-m}F_m)$ wherein n and m are integers selected from the group consisting of 1, 2, and 3, p is an integer selected from the group consisting of 0, 1, 2, 3 and 4, and the processing step includes processing the precursor using a plasma enhanced CVD process.

33. The method of claim 1 wherein the step of selecting includes selecting a precursor comprising $(C_6F_5)_n$—$SiH_{3-n}$, wherein n is an integer selected from the group consisting of 1, 2, and 3, and the processing step includes processing the precursor in a thermal CVD) process.

34. The method of claim 1 wherein the step of selecting includes selecting a precursor comprising $(C_6H_{5-p}F_p)_n$—$Si(OCH_3)_{3-n}$, wherein n is an integer selected from the group consisting of 1, 2, and 3, p is an integer selected from the group of 1, 2, 3, 4, and 5, and the processing step includes processing the precursor in a plasma enhanced CVD process.

35. The met of claim 1, wherein the step of selecting includes selecting-a precursor comprising $(C_6H_{5-n}F_n)$—$CH_{1-m}F_m$=$CH_{2-p}F_p$, wherein n is an integer selected from the group consisting of 1, 2, 3, 4 and 5, wherein m is a integer selected from the group consisting of 0 and 1, and wherein p is an integer selected from the group consisting of 0, 1 and 2.

36. A method for making a film with a dielectric constant below about 3.0 and decomposition temperature above about 300° C. comprising the steps of:
    selecting a precursor other than $HF_2C$—$C_6H_4$—$CHF_2$ comprising at least one of a $sp^2C$—F bond and a hyperconjugated $sp^3C$—F bond; and
    processing the precursor in one of a transport polymerization (TP) system and a chemical vaporization (CVD) system, said system comprising one of a thermal deposition process, a plasma enhanced process, a high density plasma process, a photon assisted process and a photon-plasma assisted process in order to deposit the film.

37. The method of claim 36, wherein the thermal process further comprises using a catalyst.

38. The method of claim 37 wherein the catalyst is one of a dehydrogenation catalyst, a reforming catalyst and an oxidative dehydration catalyst.

39. The method of claim 38, wherein the dehydrogenation catalyst is selected from the group consisting transition metal oxides and noble metals on acid supports.

40. The method of claim 38, wherein the catalyst is selected from the group consisting of noble metals and metal sulfide on active carbon.

41. The method of claim 38, wherein the catalyst is selected from the group consisting of $Ga_{13}$, $Cr_{12}$, $GaAl_{12}$ and $Al_{13}$ on PILCs.

42. The method of claim 38 wherein the catalyst comprises M—$Al_2O_3$ where M is a lanthanide.

43. The method of claim 38 wherein the catalyst comprises $Al_2O_3$ kneaded with Bi and Sb compounded with a metal selected from the group consisting of periodic table Group VIB & VIIB metals.

44. The method of claim 38, wherein the catalyst is selected from the group consisting of M-modified H-ZSM-5 and H-ZSM-11 where M is selected from the group consisting of Zn, Ga, Pt—Ga, Pt—Na, Mo, Cr, K, Ca, Mg, Al, and metals selected from periodic table Group VIII metals.

45. The method of claim 38 wherein the catalyst comprises M-modified MFI (H-GalloSilicates) where M is selected from the group consisting of Si/Ga, Na/Ga, and Al.

46. The method of claim 38 wherein the catalyst comprises a rare earth metal exchanged Y-Zeolite.

47. The method of claim 38 wherein the catalyst comprises a rare earth metal exchanged ultra stable Y-Zeolite.

48. The method of claim 38 wherein the catalyst comprises Ti oxide paired with Zr oxide.

49. The method of claim 38 wherein the catalyst comprises M plated onto aluminum, where M is selected from the group consisting of Ni, Cr, Ni/Cr, and Ni/Cr/Al alloys.

50. The method of claim 36, wherein precursor comprises $(C_6H_{5-n}F_n)$—$CH_{1-m}F_m$=$CH_{2-p}F_p$, wherein n is an integer selected from the group consisting of 1, 2, 3, 4 and 5, wherein m is a integer selected from the group consisting of 0 and 1, and wherein p is an integer selected from the group consisting of 0, 1 and 2.

51. A method for making a film comprising the steps of:
    selecting a precursor comprising at least one of a $sp^2C$—F bond and a hyperconjugated $sp^3C$—F bond comprising $(C_6H_{5-n}F_n)_m$—$SiH_{4-m}$, wherein n is an integer selected from the group consisting of 1, 2, 3, 4 and 5 and m is an integer selected from the group consisting of 1, 2, 3 and 4; and
    processing the precursor in a thermal CVD process with a primary Si source of $SiH_4$.

52. The method of claim 51 wherein the processing step further comprises using an oxidant.

53. The method of claim 52 wherein the oxidant is selected from the group consisting of $NO_2$ and $H_2O_2$.

54. A method for making a film comprising the steps of:
    selecting a precursor comprising at least one of a $sp^2C$—F bond and a hyperconjugated $sp^3C$—F bond comprising $(C_6H_{5-n}F_n)_m$—$Si(OCH_3)_{4-m}$, wherein n is an integer selected from the group consisting of 1, 2, 3, 4 and 5, and m is an integer selected from the group consisting of 1, 2 and 3, and the processing step includes processing the precursor in a plasma enhanced CVD process.

55. A method for making a film comprising the steps of:
    selecting a precursor comprising at least one of a $sp^2C$—F bond and a hyperconjugated $sp^3C$—F bond comprising $CH_{3-n}F_n$—$C_6F_4$—$CH_{3-m}F_m$ wherein n and m are integers selected from the group consisting of 1, 2, and 3, and the processing step includes processing the precursor using a plasma enhanced CVD process with a primary Si source of $SiH_4$.

56. A method for making a film comprising the steps of:
    selecting a precursor comprising at least one of a $sp^2C$—F bond and a hyperconjugated $sp^3C$—F bond;
    selecting a silane; and processing the precursor and the silane in a thermal CVD process comprising using an oxidant in order to deposit the film.

57. The method of claim 56 wherein the oxidant is selected from the group consisting of $NO_2$ and $H_2O_2$.

58. A method for making a film comprising the steps of:

selecting a precursor comprising at least one of a $sp^2C$—F bond and a hyperconjugated $sp^3C$—F bond; selecting a silane; and processing the precursor and the silane in a thermal CVD process using $CH_4$ as a primary carbon source to deposit the film.

59. A method for making a film comprising the steps of:

selecting a precursor comprising at least one of a $sp^2C$—F bond and a hyperconjugated $sp^3C$—F bond comprising $C_6F_5$—CF=$CF_2$; and processing the precursor in a high density plasma CVD process to deposit the film.

60. The method of claim 59, wherein the processing step includes using a hydrocarbon as a primary carbon source.

61. The method of claim 59, wherein the processing step includes using $CH_4$ as a primary carbon source.

62. A method for making a film comprising the steps of:

selecting a precursor comprising at least one of a $sp^2C$—F bond and a hyperconjugated $sp^3C$—F bond comprising $C_6F_5$—$Si(OCH_3)_3$; and processing the precursor in a plasma enhanced CVD process to deposit the film.

63. A method for making a film comprising the steps of:

selecting a precursor comprising at least one of a $sp^2C$—F bond and a hyperconjugated $sp^3C$—F bond comprising $(C_6F_5)_2$—$Si(OCH_3)_2$; and processing the precursor in a plasma enhanced CVD process to deposit the film.

64. A method for making a film comprising the steps of:

selecting a precursor comprising at least one of a $sp^2C$—F bond and a hyperconjugated $sp^3C$—F bond comprising $(C_6F_5)_3$—$SiOCH_3$; and processing the precursor in a plasma enhanced CVD process to deposit the film.

65. A method for making a film comprising the steps of:

selecting a precursor comprising at least one of a $sp^2C$—F bond and a hyperconjugated $sp^3C$—F bond comprising $CHF_2$—$C_6F_4$—$CHF_2$; and processing the precursor in a plasma enhanced CVD process to deposit the film.

66. A method for making a film comprising the steps of:

selecting a precursor comprising at least one of a $sp^2C$—F bond and a hyperconjugated $sp^3C$—F bond comprising $CH_2F$—$C_6F_4$—$CH_2F$; and processing the precursor in a plasma enhanced CVD process to deposit the film.

67. A method for making a film comprising the steps of:

selecting a precursor comprising at least one of a $sp^2C$—F bond and a hyperconjugated $sp^3C$—F bond comprising $(C_6H_{5-p}F_p)_n$—$Si(OCH_3)_{3-n}$, wherein n is an integer selected from the group consisting of 1, 2, and 3, p is an integer selected from the group of 1, 2, 3, 4, and 5; and processing the precursor in a plasma enhanced CVD process to deposit the film.

68. A method for making a film comprising the steps of:

selecting a precursor comprising at least one of a $sp^2C$—F bond and a hyperconjugated $sp^3C$—F bond comprising $(C_6H_{5-n}F_n)$—$CH_{1-m}F_m$=$CH_{2-p}F_p$, wherein n is an integer selected from the group consisting of 1, 2, 3, 4 and 5, wherein m is a integer selected from the group consisting of 0 and 1, and wherein p is an integer selected from the group consisting of 0, 1 and 2; and processing the precursor in at least one of a transport polymerization (TP) process and chemical vapor deposition (CVD) process, wherein the process is selected from the group consisting of thermal process, a plasma enhanced process, a high density plasma process, a photon assisted process and a photon-plasma assisted process in order to deposit the film.

* * * * *